United States Patent
Delamarche et al.

(10) Patent No.: US 10,493,450 B2
(45) Date of Patent: Dec. 3, 2019

(54) MICROFLUIDIC DEVICE WITH ANTI-WETTING, VENTING AREAS

(71) Applicant: International Business Machines Corporation, Armonk, NY (US)

(72) Inventors: Emmanuel Delamarche, Thalwil (CH); Yuksel Temiz, Zug (CH)

(73) Assignee: International Business Machines Corporation, Armonk, NY (US)

(*) Notice: Subject to any disclaimer, the term of this patent is extended or adjusted under 35 U.S.C. 154(b) by 391 days.

(21) Appl. No.: 15/431,006

(22) Filed: Feb. 13, 2017

(65) Prior Publication Data

US 2017/0151566 A1 Jun. 1, 2017

Related U.S. Application Data

(62) Division of application No. 14/662,264, filed on Mar. 19, 2015, now Pat. No. 9,604,209.

(51) Int. Cl.
| G01N 1/22 | (2006.01) |
| G01N 1/10 | (2006.01) |
| G01N 1/00 | (2006.01) |
| B01L 3/00 | (2006.01) |
| B81C 1/00 | (2006.01) |

(52) U.S. Cl.
CPC ... B01L 3/502707 (2013.01); B01L 3/502723 (2013.01); B81C 1/00 (2013.01); *B01L 2200/0615* (2013.01); *B01L 2200/0684* (2013.01); *B01L 2200/12* (2013.01); *B01L 2200/141* (2013.01); *B01L 2300/0645* (2013.01); *B01L 2300/0851* (2013.01); *B01L 2300/0858* (2013.01); *B01L 2300/0867* (2013.01); *B01L 2300/165* (2013.01); *B01L 2400/0406* (2013.01); *B01L 2400/0424* (2013.01); *B01L 2400/086* (2013.01); *B01L 2400/088* (2013.01)

(58) Field of Classification Search
CPC ... G01N 1/22; G01N 1/10; G01N 1/00; B01L 3/00
USPC ......... 422/502, 503, 504; 436/174, 180, 181
See application file for complete search history.

(56) References Cited

U.S. PATENT DOCUMENTS

| 6,601,613 B2 | 8/2003 | McNeely et al. |
| 6,955,738 B2 | 10/2005 | Derand et al. |

(Continued)

FOREIGN PATENT DOCUMENTS

| CN | 101734611 B | 8/2011 |
| CN | 101533005 B | 10/2012 |

(Continued)

OTHER PUBLICATIONS

IBM: List of IBM Patents or Patent Applications Treated as Related (Appendix P), Feb. 14, 2017, p. 1-2

(Continued)

*Primary Examiner* — Brian J. Sines
(74) *Attorney, Agent, or Firm* — Michael A. Petrocelli

(57) ABSTRACT

A microfluidic device and method for fabrication includes a microfluidic channel that has a closed portion, which comprises: a liquid pathway formed by a wetting area; and an anti-wetting area extending along and contiguously with the liquid pathway. The anti-wetting area is configured so as to provide a vent to evacuate gas along the anti-wetting area.

8 Claims, 6 Drawing Sheets

(56) References Cited

U.S. PATENT DOCUMENTS

| | | | |
|---|---|---|---|
| 6,967,101 | B1 | 11/2005 | Larsson et al. |
| 7,833,486 | B2 | 11/2010 | Fielden et al. |
| 8,905,078 | B2 | 12/2014 | Lee et al. |
| 8,919,383 | B2 | 12/2014 | Rodenfels |
| 9,604,209 | B2 | 3/2017 | Delamarche |
| 2002/0125135 | A1 | 9/2002 | Derand et al. |
| 2005/0042770 | A1 | 2/2005 | Derand et al. |
| 2005/0153434 | A1 | 7/2005 | Andersson et al. |
| 2005/0214442 | A1 | 9/2005 | Larsson et al. |
| 2006/0110294 | A1 | 5/2006 | Engstrom |
| 2008/0003145 | A1* | 1/2008 | Nurse ............... B01L 3/502738 422/400 |
| 2008/0003572 | A1* | 1/2008 | Delamarche ........ B01L 3/50273 435/6.12 |
| 2008/0163945 | A1* | 7/2008 | Nurse ............... B01L 3/502738 137/833 |
| 2012/0100041 | A1 | 4/2012 | Yang |
| 2016/0271608 | A1 | 9/2016 | Delamarche et al. |
| 2016/0367988 | A1* | 12/2016 | Azpiroz .................. B03C 5/005 |
| 2017/0151563 | A1 | 6/2017 | Delamarche |

FOREIGN PATENT DOCUMENTS

| | | | |
|---|---|---|---|
| CN | 102741559 | A | 10/2012 |
| EP | 1525916 | A1 | 4/2005 |
| EP | 2016997 | B1 | 1/2011 |
| WO | 2004067444 | A1 | 8/2004 |
| WO | 2004103890 | A1 | 12/2004 |
| WO | 2008083687 | A1 | 7/2008 |
| WO | 2016146710 | A1 | 9/2016 |

OTHER PUBLICATIONS

Pending U.S. Appl. No. 15/431,030, filed Feb. 13, 2017, entitled "Microfluidic Device With Anti-wetting, Venting Areas", pp. 1-35
Juncker et al., "Soft and rigid two-level microfluidic networks for patterning surfaces", Journal of Micromechanics and Microengineering, vol. 11, (2001), pp. 532-541.
Zorba et al., "Making silicon hydrophobic: wettability control by two-lengthscale simultaneous patterning with femtosecond laser irradiation", Nanotechnology, vol. 17, (2006), pp. 3234-3238.
Liu et al., "Manipulating liquid plugs in microchannel with controllable air vents", Biomicrofluidics, vol. 6, (2012), pp. 012815-1-012815-10.
International Search Report and Written Opinion for International Application No. PCT/EP2016/055733, filed: Mar. 16, 2016, Search Report: dated Jun. 14, 2016, pp. 1-10.
First Office Action dated Mar. 21, 2019 for CN Application 201680028583.6, 18 pages.

* cited by examiner

MICROFLUIDIC DEVICE WITH ANTI-WETTING, VENTING AREAS

BACKGROUND

The invention relates in general to the field of microfluidic devices, in particular microfluidic chips, as well as related devices and methods of operation and fabrication thereof. Microfluidics generally refers to microfabricated devices, which are used for pumping, sampling, mixing, analyzing and dosing liquids. Prominent features thereof originate from the peculiar behavior that liquids exhibit at the micrometer length scale. Flow of liquids in microfluidics is typically laminar. Volumes well below one nanoliter can be reached by fabricating structures with lateral dimensions in the micrometer range. Reactions that are limited at large scales (by diffusion of reactants) can be accelerated. Finally, parallel streams of liquids can possibly be accurately and reproducibility controlled, allowing for chemical reactions and gradients to be made at liquid/liquid and liquid/solid interfaces. Microfluidics are accordingly used for various applications in life sciences.

Many microfluidic devices have used chip interfaces and closed flowpaths. Closed flowpaths facilitate the integration of functional elements (e.g. heaters, mixers, pumps, UV detector, valves, etc.) into one device while minimizing problems related to leaks and evaporation.

SUMMARY

In an aspect of the present invention, a microfluidic device includes a substrate defining a microfluidic channel having a closed portion. The closed portion comprises, a liquid pathway formed by a wetting area. The closed portion further comprises an anti-wetting area extending along and contiguously with the liquid pathway. The anti-wetting area is configured to provide a vent to evacuate gas from the wetting area along the anti-wetting area. The anti-wetting area is advantageously configured so as to allow gas to be evacuated.

In a related aspect, the anti-wetting area is a first anti-wetting area, and the closed portion of the microfluidic channel further comprises a second anti-wetting area extending along and contiguously with the liquid pathway opposite the first anti-wetting area. The second anti-wetting area is configured to provide a vent to evacuate gas from the wetting area along the second anti-wetting area.

In a related aspect, the wetting area of the liquid pathway is formed by a bottom wall, and between lateral walls arranged on each side of the liquid pathway, and the anti-wetting area extends between one of the lateral walls and the liquid pathway. The anti-wetting area advantageously provides venting as it extends along and contiguously with a lateral wall of the microfluidic channel. The anti-wetting areas advantageously provide: liquid confinement, gas evacuation, and leak-free part mating.

In a related aspect, the wetting area of the liquid pathway is formed at least by a bottom wall and a lateral wall of the microfluidic channel, and the anti-wetting area extends along and contiguously with the lateral wall of the microfluidic channel.

In a related aspect, the microfluidic device further includes one or more non-closed portions, such that gas can be vented from the closed portion to the one or more non-closed portions, along the anti-wetting area.

In a related aspect, the microfluidic device further includes second multiple microfluidic channels connected to the microfluidic channel. Each of the second microfluidic channels having a closed channel portion, and each of the second multiple microfluidic channels comprising a liquid pathway formed by a wetting area. At least one anti-wetting area configured so as to provide a vent. The second multiple microfluidic channels connect at one end thereof into the microfluidic channel to form an intersection of closed channel portions.

In a related aspect, the anti-wetting area comprises black silicon. The black silicon is advantageous to venting and mating with surfaces and materials.

In another related aspect, the anti-wetting area mates the liquid pathway with an adjoining structure.

In another related aspect, the microfluidic device further includes a structure having an area resting on the anti-wetting area, and the anti-wetting area is configured so as to prevent liquid leak between the liquid pathway and the adjoining structure.

In another aspect, the microfluidic device further includes two liquid pathways separated by a common anti-wetting area. The common anti wetting area extends along and contiguously with each of the two liquid pathways.

In an aspect of the present invention, a method of venting a microfluidic device includes: causing liquid to advance along a wetting area on a liquid pathway to flush gas in a microfluidic channel; and venting the gas from a closed portion of the microfluidic channel along an anti-wetting area extending along and contiguous with the liquid pathway.

In another aspect of the present invention, a method of manufacturing a microfluidic device includes: forming a microfluidic channel in a substrate, the microfluidic channel having a closed portion; forming a liquid pathway using a wetting area in the closed portion; and forming an anti-wetting area in the closed portion, the anti-wetting area extending along and contiguously with the liquid pathway, the anti-wetting area being configured to provide a vent to evacuate gas from the wetting area along the anti-wetting area.

Devices and methods embodying the present invention will now be described, by way of non-limiting examples, and in reference to the accompanying drawings. Technical features depicted in the drawings are not necessarily to scale. Also some parts may be depicted as being not in contact to ease the understanding of the drawings), whereas they may very well be meant to be in contact, in operation.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
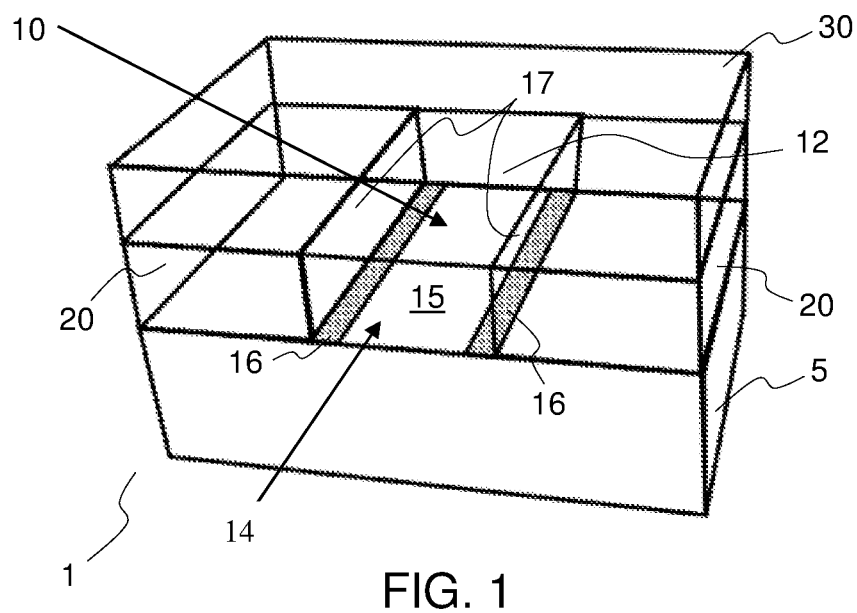
FIG. 1 is a isometric view of a simplified representation of a portion of a microfluidic chip, according to embodiments of the present disclosure.
Figure 2:
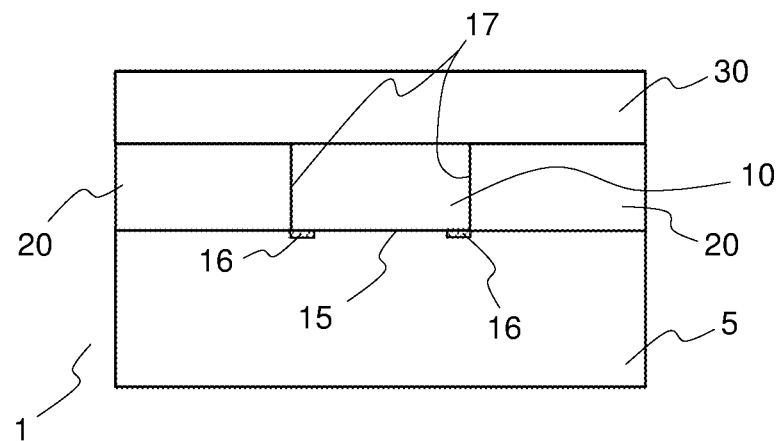
FIG. 2 is a transverse cross-sectional view of the device of FIG. 1 perpendicular to the main axis of a microfluidic channel.
Figure 3:
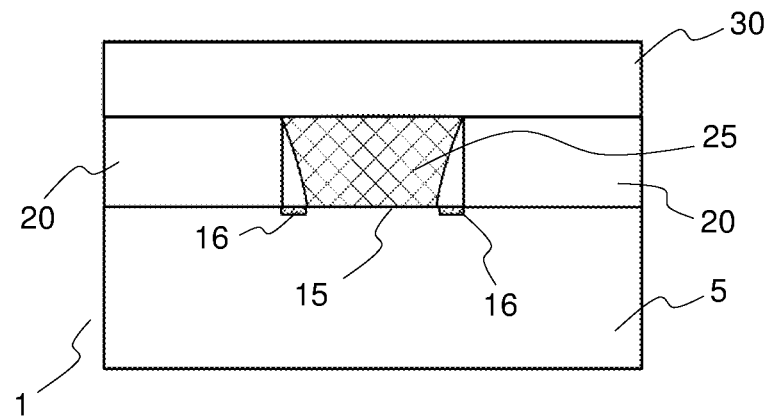
FIG. 3 is a transverse cross-sectional view of the device of FIG. 1 similar to the view of FIG. 2 and additionally illustrating a typical liquid section when liquid wets the liquid pathway.
Figure 4:
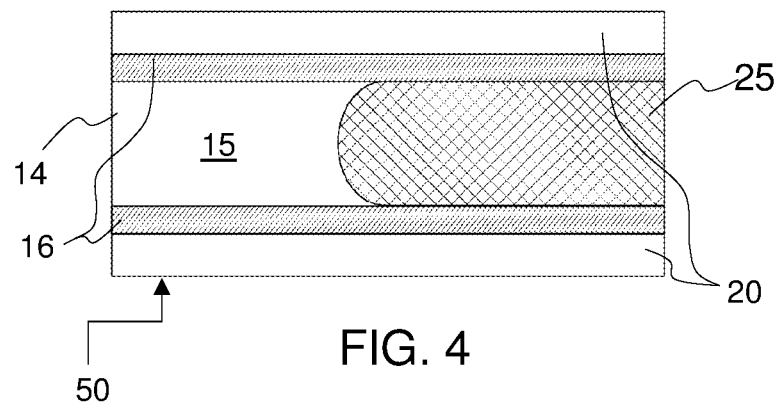
FIG. 4 shows a horizontal section cut through the device of FIG. 1, just above the wetting surface.

In reference to FIGS. 1-13, a general aspect of the invention is first described, which concerns a microfluidic device 1. The device comprises one or more microfluidic channels 10, which can be provided on a surface of the microfluidic device, or as cavities formed between two parts of the device 1, as illustrated in the drawings. At least a portion 12 of a microfluidic channel is closed, e.g., by a cover structure 30. This channel portion exhibits a liquid pathway 14, formed by a wetting area, and an anti-wetting (i.e., non-wetting) area 16 that extends along and contiguously with the liquid pathway 14. For example, in FIG. 1, the liquid pathway 14 is covered by a cover structure 30, at least in the depicted portion 12 of the channel. Other portions of the device may be non-closed, i.e., to provide apertures, so as to allow liquid to be introduced in the channels from the top.

Additionally, the anti-wetting area is furthermore configured so as to enable a vent. Thus, gas (e.g., air) surrounding the liquid, which is compressed when liquid wets and advances along the liquid pathway, can be vented along the anti-wetting area 16, e.g., via a volume or space provided above the anti-wetting area. In another example, gas can be vented through a thickness of the anti-wetting areas, if the latter has needle structure or, similarly, a network structure which blocks liquid but is permeable to gas.

Accordingly, the anti-wetting areas serve a twofold purpose. Not only do they allow a liquid 25 to remain confined to the liquid pathway 14, but they also make it possible to more easily evacuate gas, e.g., air, so as to enable a smooth liquid propagation in the device, even in closed (i.e., covered) channel portions, and even when closed channel portions have a dead-end. In a closed channel, and without a vent such as described herein, liquid needs to compress gas in the channels, which may slow down the liquid progression and possibly stop the capillary flow (in case of dead ends). The present disclosure solves the above problem, and makes it possible to provide new chip designs, and allow liquid movements and mixing that would not have been possible in previous designs. This will be discussed in more particularity with reference to FIGS. 11A-11D. In addition, anti-wetting areas may be used to marry surfaces and/or mate parts and materials so as to prevent leaks. For example, embodiments described herein make use of Si/polymer hybrid chips where anti-wetting areas are made of black silicon, which makes it possible to confine liquids, flush gases and mate parts of the device (without necessarily involving bonding or adhesives). Silicon allows for a high level of precision when processing the Silicon.

Note that, although most of the embodiments discussed herein are directed to microfluidic chips, the present concept may, in principle, also be applied to microfluidic probe heads, which are typically used for localizing liquids and chemicals/biochemicals over surfaces in a non-contact, scanning manner. For example, in some practical applications, the gas to be flushed will likely be air but other gases may be used, if needed, in particular nitrogen.

In most embodiments discussed herein, the liquid pathway is surrounded by two anti-wetting, venting areas 16, which extend along and contiguously with the liquid pathway, and are opposite to each other. It is understood that the two opposite areas 16 may in fact belong to one continuous anti-wetting area, as for instance illustrated in FIG. 11. Depending on the channel design desired, one or more anti-wetting area may be involved, which result in one or two anti-wetting portions extending along the channel(s).

Referring now to FIGS. 1-8, the wetting area of the liquid pathway 14 is formed by a bottom wall 15 of the device 1, between lateral walls 17 of a channel 10 or a closed channel portion 12. The lateral walls 17 are arranged on each side of the liquid pathway(s) 14. The anti-wetting area 16 extends, for example, between one of the lateral walls 17 and a liquid pathway 14. Thus, a volume is provided above the outer anti-wetting areas 16, which will not (at least not entirely) be filled by liquid 25, in operation (see e.g., FIGS. 3, 6 and 8), such that gas can be adequately flushed along the anti-wetting areas when liquid fills the pathway.

In one embodiment, the lateral channel walls 17 comprise silicon, it being noted that the base substrate 5 is typically made of silicon too. The wetting surface may be made of $SiO_2$, or more generally an oxide, or a metal, e.g., palladium, as discussed in more detail below. In practical embodiments, the lateral channel walls 17 may be walls of lateral structures 20 that protrudes from the bottom wall 15 of the channel, as illustrated in FIGS. 1-8. A cover structure 30 may, for example, rest on the lateral structures 20, to close the channel (or at least a portion thereof).

Figure 5:
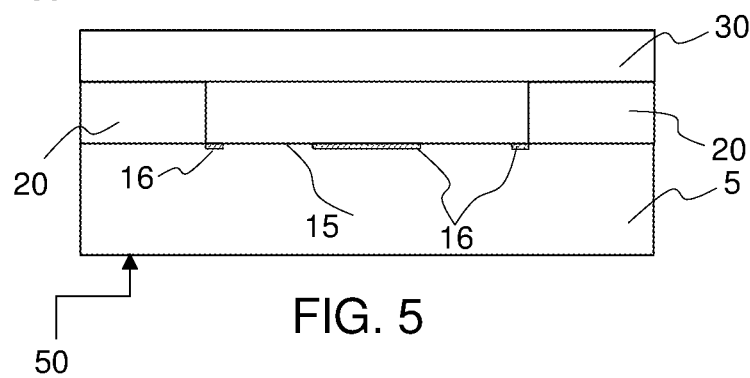
FIGS. 5-7 are cross sectional views of simplified representations of a portion of a microfluidic chip according to another embodiment, where two liquid pathways are separated by a same anti-wetting area.
Figure 6:
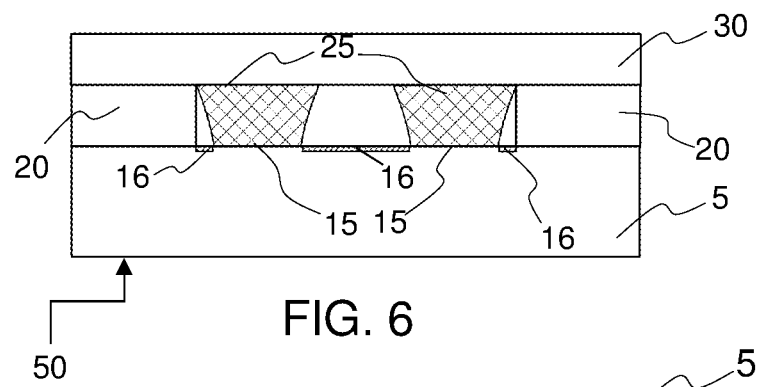
Figure 7:
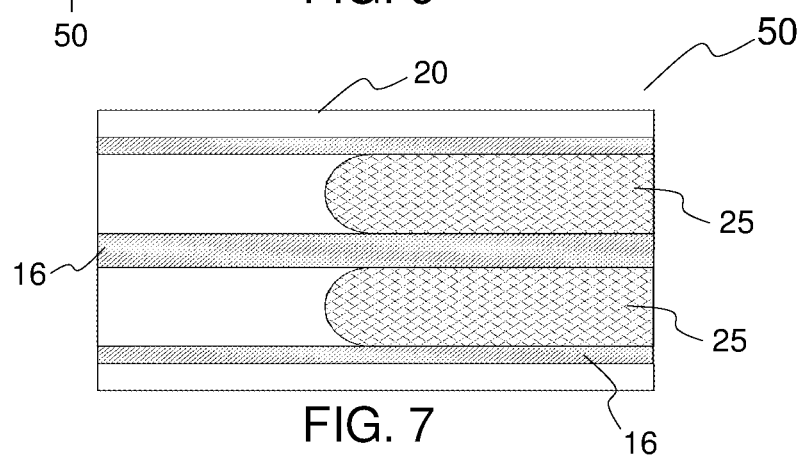

Referring more particularly to FIGS. 5-7, in another embodiment 50 according to the disclosure, two liquid pathways 14 (FIG. 1) may be formed within a same channel cavity, each pathway is formed by a respective wetting area 16. The wetting area can for instance be formed on the bottom wall 15 of the channel cavity. The two liquid pathways 14 can be separated by a same anti-wetting area 16 extending along and contiguously with each of the two liquid pathways 14. Outer anti-wetting areas 16 (as shown in FIG. 6) can be provided to confine liquid L on the respective pathways 14.

Figure 9:
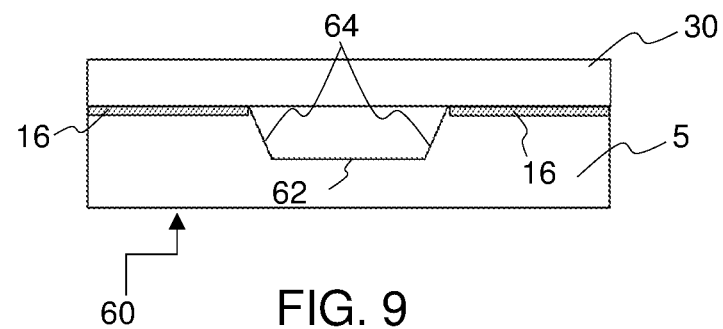
FIGS. 9 and 10 are transverse cross-sectional views of a simplified representation of a microfluidic device, wherein the anti-wetting, venting areas extend along lateral walls of the channel, according to other embodiments.
Figure 10:
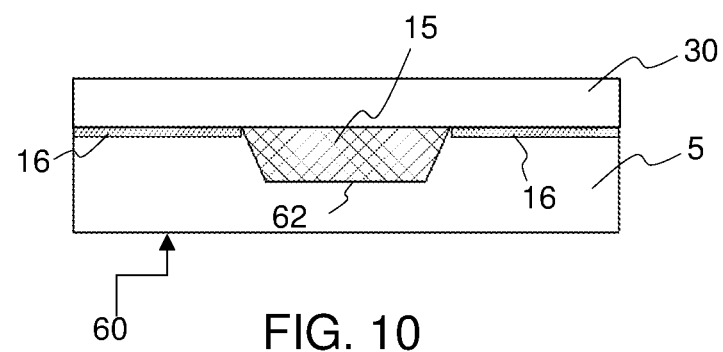
Figure 11A:
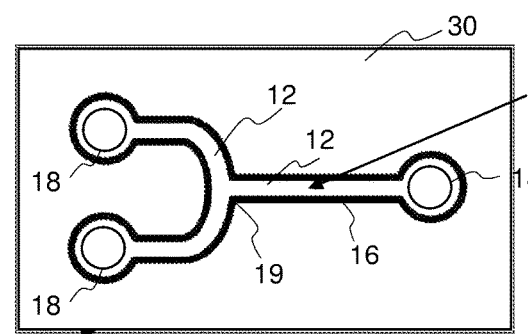
FIGS. 11A-11D are top views of a simplified representation of a microfluidic device comprising an intersection of channels, and showing how liquid can be inserted therein and wet the channels up to the intersection, while compressed air is vented through the anti-wetting areas, as in embodiments according to the present disclosure.
Figure 11B:
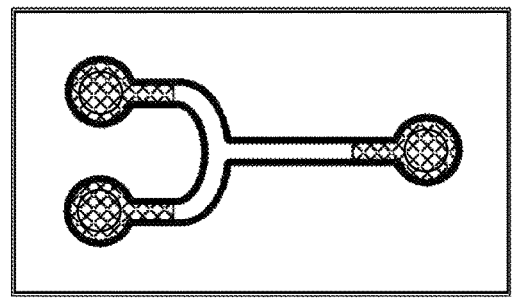
Figure 11C:
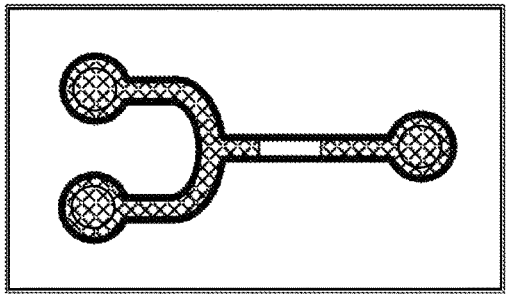
Figure 11D:
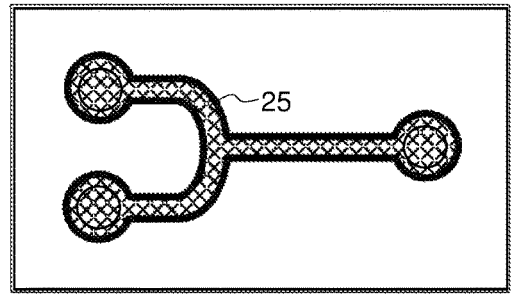
Figure 12:
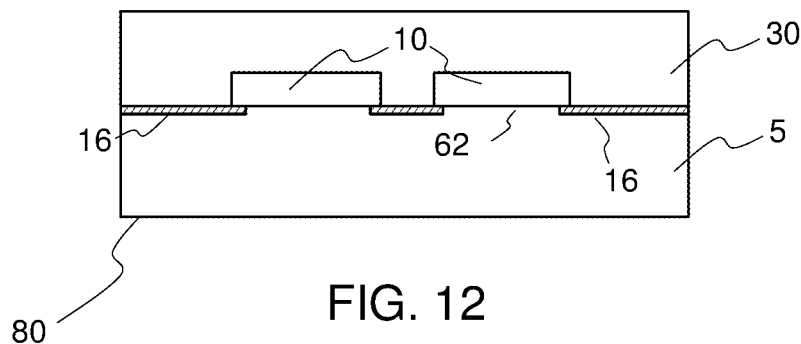
FIG. 12 shows a cross-sectional view of a simplified representation of a portion of a microfluidic device, where the channel is mainly provided in a cavity of the cover structure, according to embodiments.

Referring now to FIGS. 9-10, in another embodiment 60, the wetting area of the liquid pathway 14 is profiled (e.g., as a U or V shape). It may for instance be formed by a bottom wall 62 and a lateral wall 64 of a microfluidic channel, or by a bottom wall 62 and two lateral walls 64, as illustrated in FIGS. 9-10. In such cases, anti-wetting, venting areas 16 may advantageously extend along and contiguously with a lateral wall 64 of the microfluidic channel. Here, the anti-wetting area is configured so as to allow gas to be evacuated. The anti-wetting areas are provided in a base structure 5. As further seen in FIGS. 9-10, the anti-wetting areas are provided at an interface of the basic structure 5 and a cover structure 30.

Also, in an alternative embodiment, the anti-wetting areas may be provided in the cover structure 30. As evoked earlier, the anti-wetting, venting areas 16 can be made of a black silicon or any similar needle-shaped surface structure, or more generally any finely structured surface. An advantage of black silicon or the like is that it repels liquids. This is especially advantageous where anti-wetting areas are used at interfaces, like in FIGS. 9-10, or to mate parts, which in addition to anti-wetting properties (and thus liquid confining properties), prevents liquid leak. Also, gas can be flushed through the thickness of the anti-wetting areas, such that anti-wetting areas may possibly serve three purposes: liquid confinement, gas evacuation, and leak-free part mating.

Black Si can optionally be augmented by a thin fluorocarbon film (also on the sidewalls) to make this layer more hydrophobic (with a contact angle with water being larger than 130°). Here, black Si is formed using deep reactive ion etching process (DRIE, also known as Bosch process). This process is compatible with wafer-level high-throughput fabrication and the wetting areas (no black Si) can be masked using a photoresist, metal, or oxide layer. The process etches the Si and forms needle-like structures while leaving a fluorocarbon film ($C_4F_8$) on the sidewalls of the needles, making the structure even more hydrophobic. These needle-like structures and the fluorocarbon film are fragile and can be broken or washed away during cleaning of the photoresist after photolithography and after dicing. Therefore, the present disclosure proposes to first etch the oxide and/or metal layer using a photoresist film as a mask, partially dice the wafer (remaining photoresist acts as a protection for the wetting areas during dicing), then clean the photoresist using an organic solvent, and finally apply DRIE on the full wafer to convert Si regions to black Si while oxide and/or metal act as a mask. As the latter step is the final step before singulating the chips (e.g., by simply breaking through the partial dicing cuts), integrity of the fragile hydrophobic regions is not compromised.

Referring now to FIGS. 11A-11D, in another embodiment of a microfluidic device 70 according to the disclosure, the one or more channels are not closed on one or more other portions 18 thereof. For example, the liquid pathway 14 may not be covered by the cover structure 30 on portions 18 (e.g., apertures). Thus, in operation, gas can be evacuated from a closed portion 12, along the anti-wetting area(s) and then through the non-closed portions 18.

As evoked earlier, the present disclosure enables new chip designs. For instance, a closed portion 12 of a microfluidic channel may have a dead-end (not shown). Still, the venting areas 16 may allow gas to be evacuated. Note that in capillary-driven systems, a microfluidic channel having a dead-end can be particularly interesting because patterning air vents on the cover layer is usually not so trivial and air vents on the edges of the microfluidic chip can potentially be the source of failures, such as liquid leak from channel to outside, or a liquid leak from the outside to a channel, which can cause contamination of the channels, etc. Also, if clinical samples need to be analyzed on microfluidic chips having vents, vents may introduce biosafety issues due to the possibility of having some of the sample exiting the chip through the vents, whence the potential benefits of dead ends.

As shown in FIGS. 11A-11D, two microfluidic channels 11 may rejoin at a closed intersection 19. Namely, each channel 11 may have a liquid pathway 14 extending from a closed portion 12 to one or more non-closed portions (or apertures) 18. One microfluidic channel portion 12 may lead, at one end thereof, into another channel portion, to form an intersection 19 of liquid pathways. In the example shown in FIGS. 11A-11D, the channel design can be regarded as being formed by a curved channel, intersecting with a straight channel 11. The straight channel has one liquid aperture, whereas the curved channel joins two liquid apertures 18. Although the channel intersection 19 is closed, i.e., covered by the cover structure 30 in the example of FIGS. 11A-11D, gas can still be evacuated along the anti-wetting area 16, even when liquid is inserted via each aperture 18 at the same time. The same principle can be extended to intersections of three or more microchannels. Note that in FIGS. 11A-11D, each channel portion has two anti-wetting area portions on each side, even though the device exhibits only one continuous anti-wetting area.

As further illustrated in FIGS. 11A-11D, and according to another aspect, an embodiment can include a method of operating the microfluidic device 70, which method basically exploits the following phenomena. First, because liquid 25 can wet the (wetting) liquid pathway 14, it naturally advances thereon. This, in turn, causes pushing and flushing of surrounding gas in the microfluidic channel 11. Meanwhile, the gas, pushed by the liquid, evacuates from the closed portion 12 along the anti-wetting through the venting area(s) 16. Gas may notably evacuate through apertures 18, as depicted in FIGS. 11A-11D and/or through openings on the edges (not shown). Liquid can be introduced via apertures 18 or, in variants (not shown) be fed from adjoining structures (tubings, vias, etc.) in fluid communication with channels of the device 70.

As briefly addressed earlier, the anti-wetting area(s) 16 (or at least some of them) may advantageously be arranged and designed for mating the liquid pathway with an adjoining structure. The adjoining structure may for instance be a lateral structure wall (shown in FIGS. 1-8), as evoked earlier. It may also be a structure covering or tenting over the channels, like a cover structure (shown in FIGS. 9, 10, 12-14). In particular, devices may use black Si to mate structures, e.g., marry surfaces and materials, as needed to ensure a leak free mating. Using black Si to mate two structures results in the two parts being put in contact, or clipped, without necessarily requiring bonding, gluing, adhesives, lamination, etc. For example, the weight of one part can suffice to make it rest, or press, on the other part. Two parts may also be mated by positioning them near one another on a common carrier, via the black Si areas. In that respect, black Si may also be used for mating areas, whose purpose is to mate parts, independently from the venting areas 16.

Figure 13:
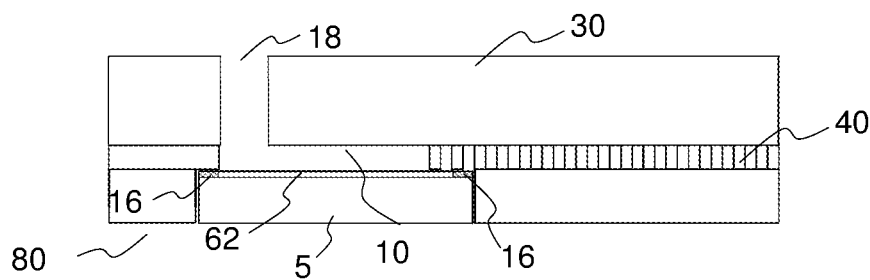
FIG. 13 shows a cross-sectional view of a portion of a microfluidic chip where a channel is mainly provided by a cavity of the cover structure, which further exhibits a capillary pump, according to an embodiment.
Figure 14:
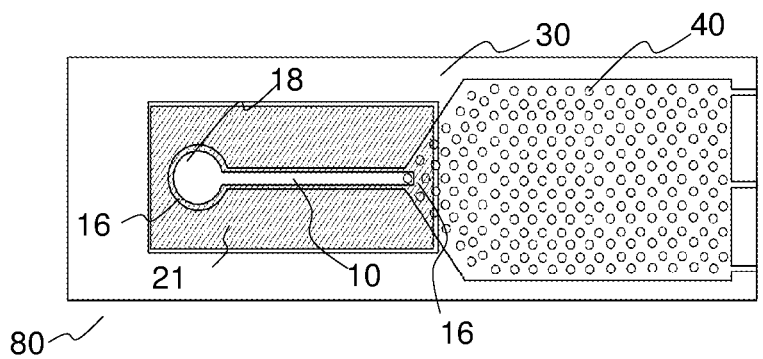
FIG. 14 shows a top view of a portion of a microfluidic chip, where a channel is again mainly provided by a cavity of the cover structure, which further exhibit a capillary pump, according to embodiments.

In embodiments illustrated in FIGS. 9, 10, 12-14, the device 80 comprises a structure 30 (e.g., a cover structure) that has an area resting on the anti-wetting, venting area 16. The anti-wetting areas can accordingly prevents liquid leaks between the liquid pathway 14 and the structure 30. The structure 30 can for instance be a plastic cartridge or a plastic chip (FIGS. 12-14) or a cover structure 30 (FIG. 9, 10). Note that, in FIG. 13, the parts 5 and 30 are not represented "in contact". Rather, a small gap is depicted between the surface of the base chip 5 and the adjoining structure 30, to ease the understanding of the drawings. Again, using black Si is particularly advantageous, and this, especially when the area of the top structure is not perfectly flat. The area of the top structure may indeed not be perfectly flat, due to probable thickness variations during the plastic molding process. For example, biological reagents can be deposited, integrated, or patterned on the silicon chip 5 (having wetting/anti-wetting areas) or on the plastic chip and then the two chips 5, 30 can be mated without using any adhesive or temperature, which could damage the reagents (FIGS. 13, 14). The pipetted liquid propagates along the wetting areas on the silicon chip without trapping air (or gas) and then bridges to the plastic chip 30 (e.g., made of hydrophilic PMMA), where the capillary pump structures 40 to pull the liquid. This implementation can be scaled to several parallel channels as otherwise illustrated in FIG. 6, for multiplexing purposes.

The own weight of the adjoining structure 30 may suffice, without it being necessarily to bond it to the base chip 5, in practice. However, one may add adhesive in areas of the structure 30 that are reasonably far away from the channels, to prevent contamination of the channel. This way, one makes sure that the structure 30 does not fall off. The adhesive could also be applied from the edges or from backside to minimize interferences. An adhesive tape could also be applied from the backside. In variants, the structure 30 can be mechanically clamped, e.g. a top plastic part and a bottom plastic part can be clipped together.

Figure 8:
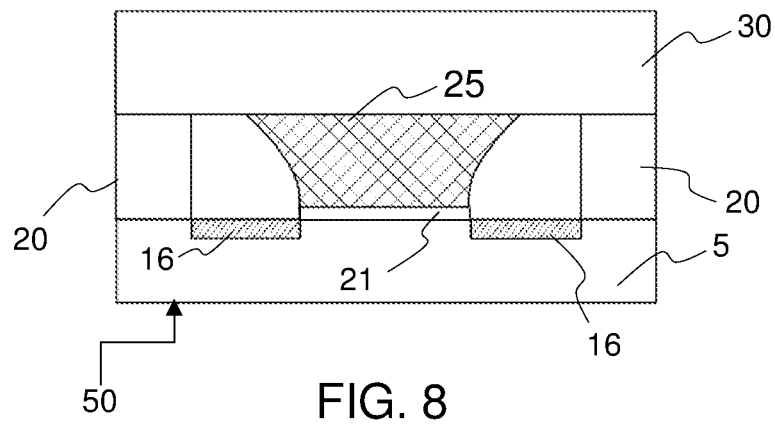
FIG. 8 depicts a cross-sectional view of a simplified representation of a variant to the embodiment of FIG. 2, wherein the wetting area of the liquid pathway is formed on a layer of material (oxide or metal) on top of a bottom wall of the substrate, according to an embodiment of the present disclosure.

The wetting area of the liquid pathway 14 preferably comprises an oxide, a metal, or even a combination thereof. Referring to FIG. 8, the wetting area of the liquid pathway 14 may for instance be provided by a metal layer 21, for example palladium. Silicon oxide can also be used (it can be fabricated, e.g., by thermal oxidation, from a silicon substrate). Note, however, that one may use both thermally grown (>5 nm) or native oxide (2-3 nm) that naturally forms on silicon (e.g., a Si wafer), as a wetting surface. Alternatively, wetting areas made of a combination of metal and oxide structures can also be used. The oxide layer or the metal layer 21 can, each, be used as a mask for the black silicon formation. Using metal, however, is advantageous as it can also serve as electrodes, for example for "liquid gating" (i.e. controlling liquid wetting and/or passage in microchannels using electrical potentials), dielectrophoresis or other types of electrical stimulation or detection. For instance, in FIG. 8, the cover structure 30 can be made from a 50 μm film of epoxy-based DF-1050 dry-film resist or a plastic material, such as PMMA. The lateral spacer structures 20 too can be made of the same dry-film resist (50 μm thick) patterned by photolithography or a double-sided tape cut by a cutting die or an electronic draft cutter. The layer 21 can for instance be a 50 nm layer of palladium, resting on a 200 nm $SiO_2$ layer on top of the bulk Si Substrate 5.

It can be observed that liquid flows much faster on wider hydrophilic patterns and can furthermore follow a curved path. These two things are achieved in the context of this disclosure. Surfactant in the solution may significantly increase the flow rate. However, liquid will advance more towards the lateral direction. Therefore, for solutions with surfactants, extra lateral spacing might be beneficial, as illustrated in FIG. 8.

According to another aspect, the present disclosure may also be embodied as a method of fabrication of a microfluidic device 1 such as described above. Essentially, such a method revolves around fabricating an anti-wetting area 16 on one (or even each of) a first layer (e.g., a substrate) 5, which may for instance have microchannel cavities already machined thereon, and a second layer 30, e.g., a cover structure 30 for the substrate 5, to form the anti-wetting, venting area 16. As noted earlier, the anti-wetting areas 16 may be fabricated on the cover structure 30, rather than on the layer carrying the channels. However, this might pose problems of placement. In one preferred embodiment, the fabrication comprises obtaining black Silicon to form the anti-wetting area(s) 16.

In one embodiments the wetting areas can be made of $SiO_2$. An example of a fabrication method is discussed herein. Assume that the substrate comprises silicon, the latter can be oxidized to form a $SiO_2$ layer thereon. Then, one may etch an area of the $SiO_2$ layer and convert the etched area to black silicon, to obtain the desired anti-wetting areas. The black Si conversion may for instance use a reactive ion etching procedure, where the surrounding (non-etched) area of the $SiO_2$ layer acts as a mask for the reactive ion etching procedure. Note that etching $SiO_2$ may not be sufficient to obtain a permanent anti-wetting area. Silicon may be hydrophobic for some time, but a native oxide would likely form and make the surface hydrophilic again. Thus, one may convert the Si areas (etched $SiO_2$) to black Si using reactive ion etching, where the surrounding $SiO_2$ layer acts as a mask. In variants, a metal layer can be obtained for the liquid pathway, which can act as a mask too.

Figure 15:
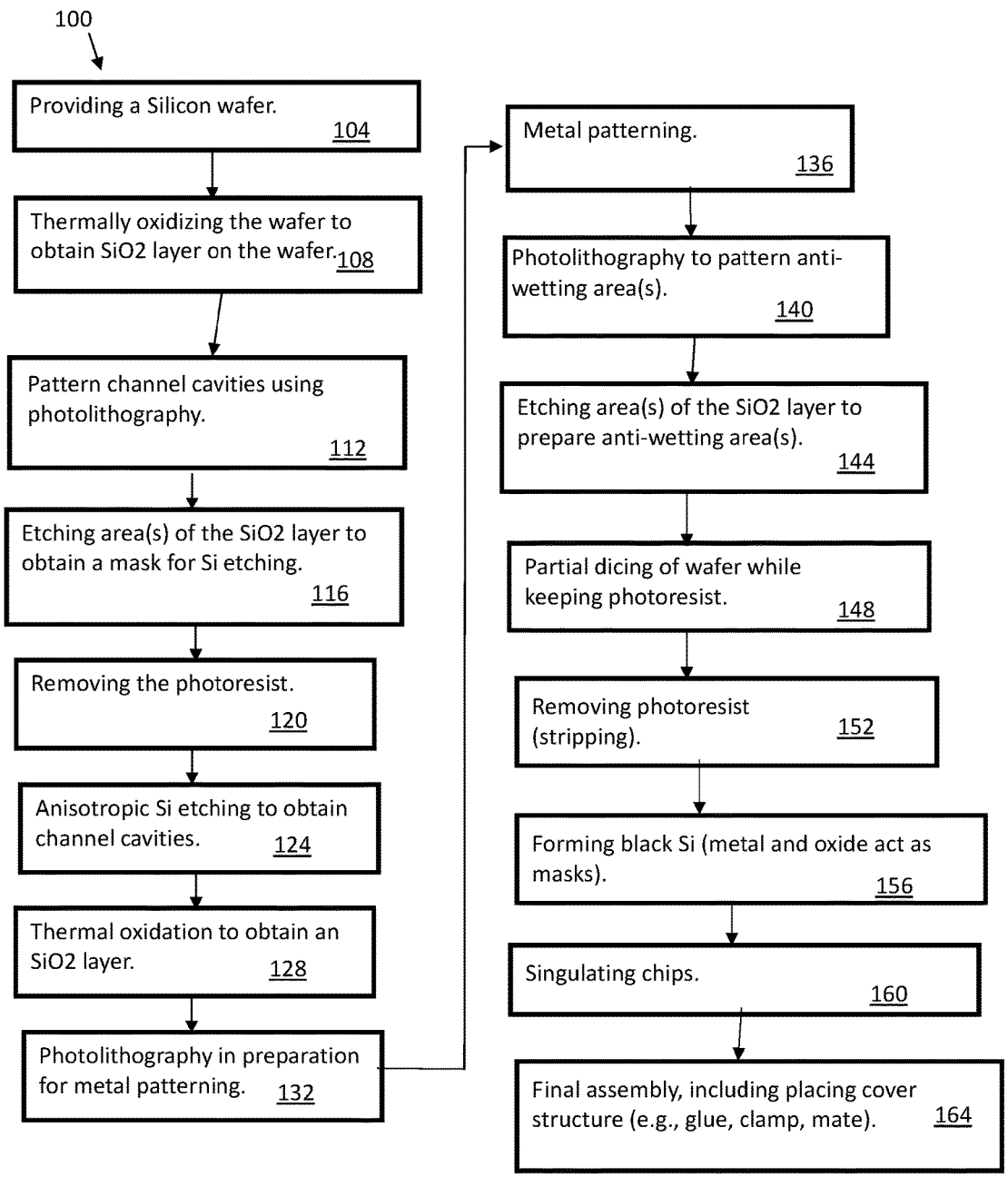
FIG. 15 is a flowchart illustrating steps of a method of fabrication of a microfluidic device according to one or more embodiments of the present disclosure.

A detailed fabrication method 100 is now described regarding the device of FIG. 14, and referring to FIG. 15. First, a Si wafer is provided, as in block 104. The wafer is thermally oxidized, to obtain a $SiO_2$ layer on the wafer, as in block 108. Photolithography is used to pattern the channel cavities (with a photoresist), as in block 112. Such photolithographic steps typically include a photoresist coating, baking, exposure and development. Areas of the $SiO_2$ layer are etched to obtain a mask for the subsequent Si etching, as in block 116. The photoresist can be removed, as in block 120. A self-limited anisotropic Si (wet) etching can be performed, to obtain the channel cavities, as in block 124. A thermal oxidation is then carried out to obtain a $SiO_2$ layer also within the channel cavities, as in block 128. Photolithographic applications are performed for preparing the subsequent metal patterning as in block 132, and then the metal patterning 136 is performed. In general, metal patterning is optional. It may however be advantageous for some applications, e.g., for microfluidic applications that utilizes electrical detection/control. Additional photolithographic steps are used to pattern the anti-wetting areas, as in block 140. One or more areas of the $SiO_2$ layer are etched to prepare the anti-wetting areas, as in block 144. It is judicious to proceed to partial dicing at this point, to avoid contamination at a later stage, as in block 148. Note that some photoresist is still present in the channel before dicing, so as to serve as a protection layer for the channels. The photoresist can be removed, for example, by stripping the photoresist, as in block 152. The etched $SiO_2$ areas (Si) are converted to black silicon, to obtain the anti-wetting areas, as in block 156. The black Si conversion may again use reactive ion etching, where the surrounding (non-etched) area of the SiO$_2$/metal layers act as a mask. Then, the partially-diced chip can be singulated, as in block 160. Final assembly and packaging steps are performed, as in block 164. Here an adjoining structure can be placed, clamped, or glued if necessary.

The above embodiments are described in reference to the accompanying drawings and may accommodate a number of variants. Several combinations of the above features may be contemplated, leading to various advantages. For instance, any two or more of the following features can be combined:

- Pairs of non-wetting areas can be created alongside the microchannel portions;
- The anti-wetting areas can be made of black silicon. Black Si provides "needle-like" structures, which possibly can be augmented by a thin fluorocarbon film (also on the sidewalls) to make this layer very hydrophobic;
- The wetting areas can be made of Si/SiOx, or a metal, such as palladium. Aluminum too can be used, amongst other examples of metal;
- For Si-based wafers, black Si can also be formed at other areas, e.g., areas coming in contact with adjoining structures (such as a cover layer) to prevent leaks. In particular, black Si can be patterned between a cover structure and the top surface of lateral walls of microchannels to prevent leakage, in addition to venting capability;
- An anti-wetting area may extend between a lateral wall and the wetting flowpath to give rise to a coexistence of air volume (in the black Si and on top of it) with liquid in the microchannels, an hydrophilic flow path is formed between the bottom and top cover layer, such that microchannels are self-venting;
- Microfluidic structures can also be formed on the cover layer. Black Si may here act as a non-wettable hydrophobic barrier between the substrate and the cover layer. For example, an injection molded plastic microfluidic chip can be designed, which is sealed with a planar Si cover having black Si areas, patterned metal and sensors, etc.; and
- Multiple liquids can merge at intersections (closed or covered) without trapping air in between them.

Some of the methods described herein can be used in the fabrication of microfluidic chips. The resulting chips can be distributed by the fabricator in raw wafer form (that is, as a single wafer that has multiple unpackaged chips, which are, however, already covered, e.g., by a film, to close portion of channels), as a bare die (again, covered), or in a packaged form. In the latter case the chip is mounted in a single chip package (such as a plastic carrier) or in a multichip package. In any case the chip can then be integrated with other chips, or other elements.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other material than silicon may be used for the base substrate. For example, one may use black germanium, which can be obtained by a plasma etch process with high aspect ratio, and which shows superhydrophobicity as well. One may also use structure patterns on plastics using hot embossing to tune the wetting properties (hydrophobic, hydrophilic) and then use plasma polymerization or other surface coatings techniques on plastic surfaces to make them superhydrophobic.

According to embodiments of the present disclosure, the present invention is embodied as a microfluidic device. The device comprises one or more microfluidic channels, e.g., formed or grooved on a surface of the microfluidic device. At least a portion of a microfluidic channel is closed, i.e., the channel has a closed cross-sectional section in this portion. The channel may, for example, be covered by a cover structure, at least in the section, to close that portion. This section comprises a liquid pathway formed by a wetting area and an anti-wetting area extending along and contiguously with the liquid pathway, so as to confine liquid on the wetting area. In order to allow gas to be evacuated, the anti-wetting area is furthermore configured as a vent. Accordingly, the gas (e.g., air) surrounding the liquid, which is flushed when liquid wets and advances along the liquid pathway, can be vented through the vent enabled by the anti-wetting area.

In the embodiments of the present disclosure, the above device may exhibit one or more of the following features:

- The anti-wetting area is a first anti-wetting area, and the portion of the microfluidic channel further comprises a second anti-wetting area, extending along and contiguously with the liquid pathway, opposite to the first anti-wetting area, and configured so as to provide a vent, to evacuate gas along the second anti-wetting area;
- The wetting area of the liquid pathway is formed by a bottom wall, between lateral walls arranged on each side of the liquid pathway, the anti-wetting area extending between one of the lateral walls and the liquid pathway;
- The lateral channel walls can comprise silicon;
- The wetting area of the liquid pathway is formed at least by a bottom wall and a lateral wall of the microfluidic channel, and the anti-wetting area extends along and contiguously with said lateral wall of the microfluidic channel;
- The microfluidic device further comprises one or more non-closed portions, such that, in operation, gas can be vented, from the closed portion to the one or more non-closed portions, along the anti-wetting area;
- The microfluidic device further comprises two microfluidic channels, each according to said microfluidic channel, such that the device comprises two closed channel portions, each comprising a liquid pathway formed by a wetting area and at least one anti-wetting area configured so as to provide a vent, and one of the two channel portions leads, at one end thereof, into another one of the two channel portions, to form an intersection of closed channel portions;
- The anti-wetting area can comprise black silicon;

The anti-wetting area mates the liquid pathway with an adjoining structure;

The microfluidic device can further comprise a structure having an area resting on the anti-wetting area, the latter configured so as to prevent liquid leak between the liquid pathway and the adjoining structure;

The wetting area of the liquid pathway can comprise one of: an oxide; a metal; and a combination of a metal and an oxide;

The wetting area of the liquid pathway can comprise a metal, the metal being palladium;

The microfluidic device can further comprise two liquid pathways separated by a same anti-wetting area, which extends along and contiguously with each of the two liquid pathways;

The portion of the microfluidic channel can have a dead-end; and

The device can be a microfluidic chip.

For instance, most embodiments described hereunder make use of anti-wetting, venting areas, extending along the liquid pathway, on each side thereof. An anti-wetting area may for instance extend between a lateral wall and a (wetting) bottom surface forming the liquid pathway. In variants, anti-wetting areas may extends along wetting lateral walls of the microfluidic channel, e.g., on the top surface of lateral structures. Anti-wetting areas may thus be provided at an interface with the cover structure. The channel cavities and anti-wetting areas may otherwise be machined or patterned either in the basis substrate (e.g., wafer) or in the cover structure, or both. Also, the cover structure may have apertures, to allow liquid to be pipetted and to evacuate flushed gases. The anti-wetting, venting areas are advantageously made of black silicon, which has numerous advantages, not only for venting gas but also to mate surfaces and materials.

According to another aspect, the invention can be embodied as a method of operating a microfluidic device such as described in any of the above embodiments, where liquid is caused to wet and advance on the liquid pathway, thereby flushing gas in the microfluidic channel, so that gas may evacuate from the covered portion, along the anti-wetting area. Preferably, the method further comprises, prior to causing liquid to wet and advance on the liquid pathway, inserting said liquid via said one or more non-closed portions.

According to a final aspect, the present disclosure can also be embodied as methods of fabrication of a microfluidic device such as described above. Notably, such methods may comprise: fabricating an anti-wetting area on one or each of: a substrate and a cover structure for said substrate, to form said anti-wetting area.

Preferably, fabricating the anti-wetting area comprises obtaining black Silicon to form the anti-wetting area. More preferably, the substrate comprises silicon, and the fabrication method further comprises: oxidizing the substrate to form a $SiO_2$ layer on the substrate; etching an area of the $SiO_2$ layer; and converting the etched areas to black silicon, to obtain said anti-wetting area, wherein converting the etched areas uses a reactive ion etching procedure, the surrounding non-etched area of the $SiO_2$ layer acting as a mask for the reactive ion etching procedure.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of venting a microfluidic device, comprising:
causing liquid to advance along a wetting area on a liquid pathway to flush gas in a microfluidic channel, the wetting area of the liquid pathway having a bottom wall and a lateral wall as part of the microfluidic channel; and venting the gas outside the microfluidic channel, from a closed portion of the microfluidic channel along an anti-wetting area extending along and contiguous with the liquid pathway, and the anti-wetting area extending along and contiguously with the lateral wall of the microfluidic channel and parallel to the liquid pathway, the anti-wetting area being configured to provide a vent to evacuate gas from the wetting area along the anti-wetting area.

2. The method of claim 1, further comprising:
prior to causing a liquid to advance along the wetting area on the liquid pathway, inserting the liquid via one or more non-closed portions of the microfluidic channel.

3. The method of claim 1, wherein the anti-wetting area is a first anti-wetting area, and the method further comprises:
venting gas from the wetting area along a second anti-wetting area in a closed portion of the microfluidic channel, the second anti-wetting area extending along and contiguously with the liquid pathway opposite the first anti-wetting area.

4. The method of claim 1, wherein two liquid pathways are separated by a common anti-wetting area, the common anti wetting area extends along and contiguously with each of the two liquid pathways.

5. The method of claim 1, wherein the wetting area of the liquid pathway is formed at least by a bottom wall and a lateral wall of the microfluidic channel, and the anti-wetting area extends along and contiguously with the lateral wall of the microfluidic channel.

6. The method of claim 1, further comprising:
venting the gas from the closed portion to one or more non-closed portions, along the anti-wetting area.

7. The method of claim 6, wherein the microfluidic device includes second multiple microfluidic channels connected to the microfluidic channel, each of the second microfluidic channels having a closed channel portion, each of the second multiple microfluidic channels comprising a liquid pathway formed by a wetting area and at least one anti-wetting area configured so as to provide a vent, and wherein the second multiple microfluidic channels connect at one end thereof into the microfluidic channel to form an intersection of closed channel portions.

8. The method of claim 1, wherein the closed portion of the microfluidic channel has a dead-end.

* * * * *